(12) United States Patent
Blish, II et al.

(10) Patent No.: US 6,461,879 B1
(45) Date of Patent: Oct. 8, 2002

(54) METHOD AND APPARATUS FOR MEASURING EFFECTS OF PACKAGING STRESSES OF COMMON IC ELECTRICAL PERFORMANCE PARAMETERS AT WAFER SORT

(75) Inventors: Richard C. Blish, II, Saratoga; mp## Sidharth, San Jose, both of CA (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 0 days.

(21) Appl. No.: 09/757,118

(22) Filed: Jan. 9, 2001

(51) Int. Cl.⁷ .......................... H01L 21/66; G01R 31/26
(52) U.S. Cl. .............................. 438/14; 438/15; 438/16; 438/17
(58) Field of Search .............................. 488/14; 438/15, 438/16, 17

(56) References Cited

U.S. PATENT DOCUMENTS 4,603,867 A * 8/1986 Babb et al. .................... 279/3
6,147,506 A * 11/2000 Ahmad ........................ 324/760

* cited by examiner

Primary Examiner—David Nelms
Assistant Examiner—Renee' R. Berry
(74) Attorney, Agent, or Firm—Paul J. Winters

(57) ABSTRACT

In the testing of one or more die as part of a semiconductor wafer, electrical testing of an unstressed die of a wafer is undertaken. The die of the wafer is then physically stressed to a first stressed state, and electrical testing is undertaken thereon. The die of the wafer is then physically stressed to a second stressed state, and electrical testing is again undertaken on the die as it is in its second stressed state. The results of the tests are compared and extrapolated to indicate electrical performance of the die in other physically stressed states. A relatively simple tool is provided for use in performing in this method in an effective and rapid manner.

10 Claims, 4 Drawing Sheets

METHOD AND APPARATUS FOR MEASURING EFFECTS OF PACKAGING STRESSES OF COMMON IC ELECTRICAL PERFORMANCE PARAMETERS AT WAFER SORT

BACKGROUND OF THE INVENTION

1. Field of the Invention

This invention relates generally to semiconductor device testing, and more particularly, to testing of semiconductor devices of a wafer.

2. Discussion of the Related Art

In the processing of semiconductor devices, after the formation of a number of integrated circuit devices on a silicon wafer, and prior to sawing the wafer into individual die, each integrated circuit device undergoes a succession of electrical tests including, for example, tests for open circuits, shorts, device logic functions, and device speed. This is typically undertaken (FIG. 1) by positioning the wafer 16 on a vacuum chuck 10, vacuum being applied to passages 12 on the substantially flat surface 14 of the chuck 10 and holding the wafer 16 onto the surface 14 of the chuck 10, so that the wafer 16 is also held in a substantially flat, i.e., physically unstressed state. Then, individual integrated circuit devices of the wafer 16 are contacted by electrical probes 18 and the tests specified above are undertaken on each of the integrated circuit devices in succession. Those integrated circuit devices that do not successfully pass the tests are marked, and, after sawing the wafer 16 into individual die, are discarded. The remaining die, having passed the electrical tests, go through the steps of die attach, wire bond, encapsulation, final electrical test, mark and pack.

During the die attach step, individual die 20 are secured to a copper lead frame 22 by means of epoxy 24, for example, silver-filled epoxy 24 (FIG. 2). In this process, the die-epoxy-lead frame combination is heated to a temperature of, for example, 175° C. for a period of, for example 30 minutes, to cure the epoxy 24, and then the structure is allowed to cool. During this cooling process, the silicon die 20, with a low coefficient of thermal expansion, shrinks a very small amount, while the copper 22, with a high coefficient of thermal expansion, shrinks a substantial amount. This results in the top surface of the die 20 being stretched so as to be physically stressed radially toward its center, as shown in FIG. 3 (see arrows). This change in the die 20 from an unstressed to a stressed state can result in significant changes in the electrical characteristics of the die 20, as compared to those revealed by the testing of the die 20 as part of the wafer 16, in an unstressed state. These differences in electrical characteristics will only be revealed upon final electrical test, that is, after the long and expensive series of operations including saw, die attach, wire bond and encapsulation.

If the changes in electrical characteristics due to changes in the stressing of the die 20 could to some degree be known prior to the sawing of the wafer 16 into individual die 20, it could with some certainty be predicted which integrated circuit devices, while passing the electrical tests at the wafer level, would be perturbed or fail at the packaged level, so that the expensive steps of saw, die attach, wire bond and encapsulation would not be undertaken on those die. In addition, if the changes in electrical characteristics due to changes in the stressing of the die could be known, such changes could be compensated for in the initial design of the integrated circuit device, resulting in a higher number of packaged devices passing final electrical testing.

Therefore, what is needed is a process that allows prediction of the performance of an electrical device after packaging thereof based on testing of the die at the wafer level, and a tool for use in such process. Furthermore, the process should be simple and effective, and the tool itself should also be simple and convenient in use in furtherance of practicing the process.

SUMMARY OF THE INVENTION

The present process is a method for testing one or more die as part of a semiconductor wafer, comprising electrically testing a die of a wafer in an unstressed state, physically stressing the die of the wafer to a first stressed state, electrically testing the die in its first stressed state, physically stressing the die of the wafer to a second stressed state, electrically testing the die in its second stressed state, and comparing the electrical test results of these steps. The tool for undertaking this process has a tool body which includes an annular portion on which the wafer is supported, and a recessed portion into which vacuum is applied, to provide for bending of the wafer into the recessed portion to stress the die of the wafer.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiment of the present invention which illustrates the best mode presently contemplated by the inventor for practicing the invention.

Figure 1:
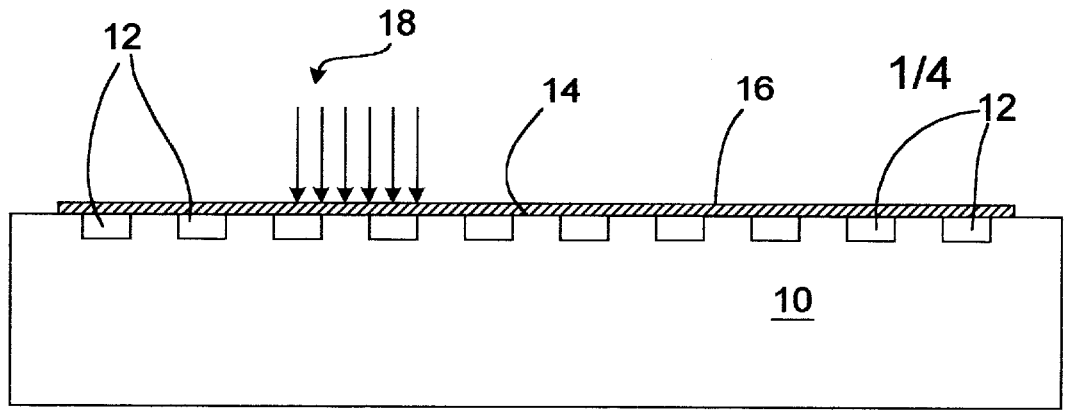
FIG. 1 is a side view of a wafer mounted on a chuck, the die on the wafer being probed for electrical testing, in accordance with the prior art.
Figure 2:
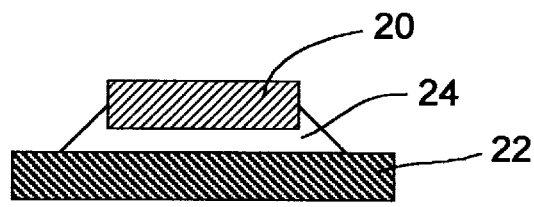
FIG. 2 is a side view of an individual die mounted on a copper lead frame, in accordance with the prior art.
Figure 4:
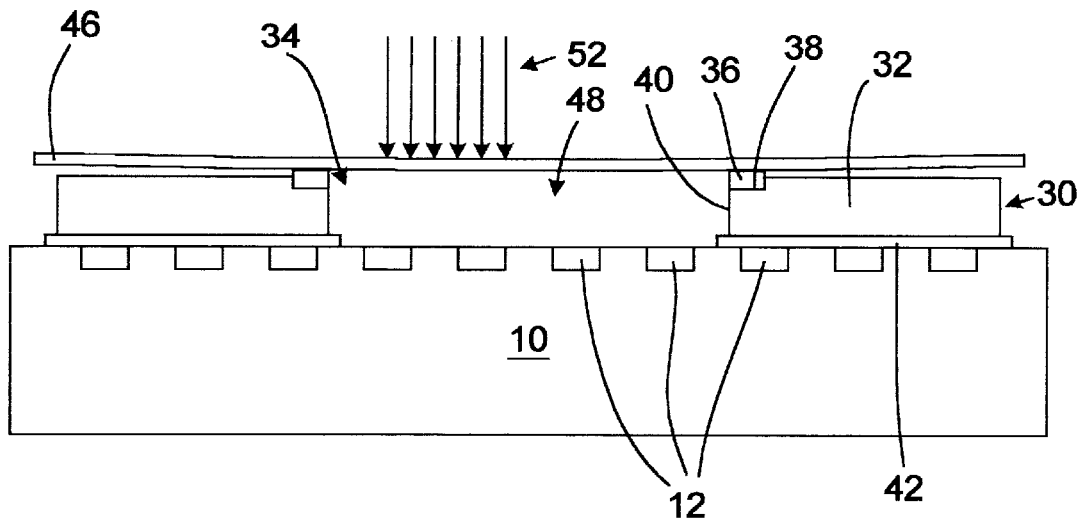
FIG. 4 is a side view showing the tool of the present invention, and showing the present process being undertaken.
Figure 6:
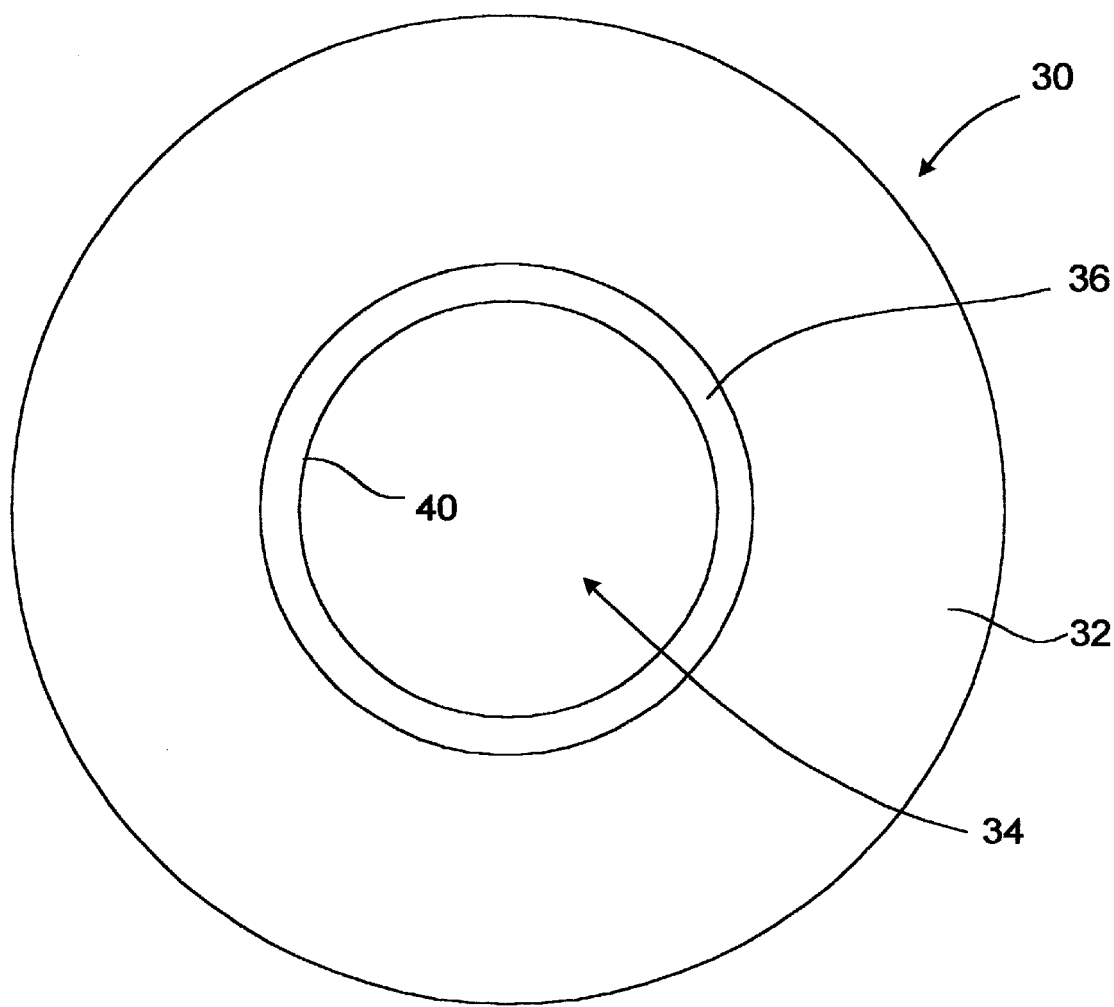
FIG. 6 is a plan view of the tool of FIGS. 4 and 5.

FIG. 4 illustrates the tool 30 used in the present process, which tool 30 is shown in plan view in FIG. 6. The tool 30 is made up of a ring member 32 of for example stainless steel, defining a passage 34 therethrough, and a resilient ring-shaped seal 36 seated in an annular recess 38 defined by the inner periphery or sidewall 40 of the ring member 32. In the use of the tool 30, a substantially flat, resilient seal 42 is positioned on a vacuum chuck 10 (similar to that shown in FIG. 1). Passage 34 allows communication of the ports 12 of the vacuum chuck 10 with the underside of a semiconductor wafer 46. Wafer 46 has a plurality of integrated circuits formed thereon and is placed on the tool 30 as shown in FIG. 4, supported by the annular seal 36. The wafer 46 is held in place by application of vacuum from the ports 12 of the vacuum chuck 10 to the underside of the wafer 46.

FIG. 4 shows the application of vacuum into the chamber 48 defined by the inner sidewall 40 of the ring member 32, seal 36, seal 42, the underside of the wafer 46, and the vacuum chuck 10, such vacuum being applied by the ports of the vacuum chuck 10. Application of this vacuum to the chamber 48, it will be seen, causes the wafer 46 to bend to an extent as shown in FIG. 4, into the recess defined by the passage 34 in the ring member 32, the seal 36 maintaining sealing relation of the wafer 46 with the tool 30 as the wafer 46 bends.

Figure 7:
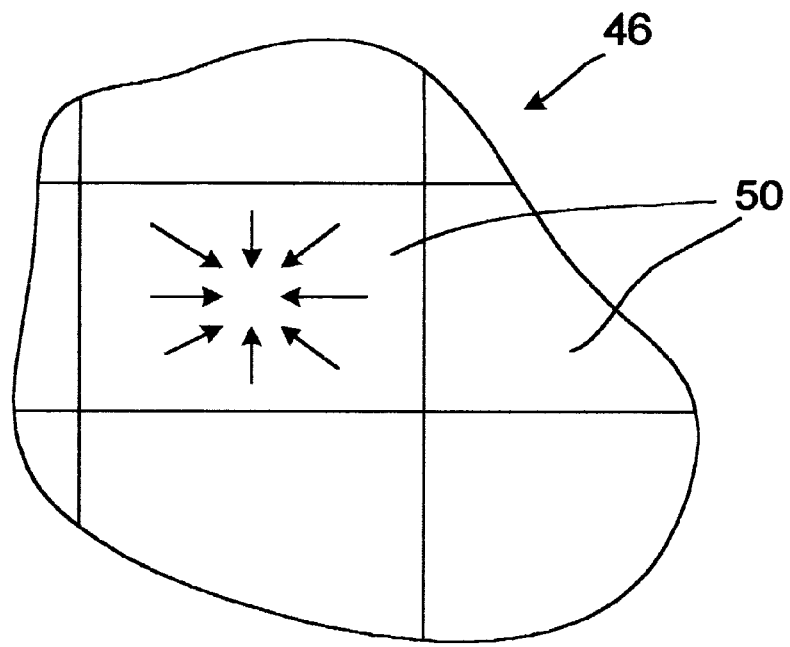
FIG. 7 is a plan view of a portion of a wafer, showing the stresses placed on die of the wafer, in accordance with the practice of the invention as shown in FIG. 4.

The stressing of die 50 (FIG. 7) of the wafer 46 will be of a given magnitude, depending on the extent of bending of the wafer 46, and the top surface of each die 50 will be under compressive force so as to be physically stressed radially inwardly toward the center of the die 50, as shown in FIG. 7, corresponding to the state of the wafer 46 as shown in FIG. 4.

Referring again to FIG. 4, a die 50 of the wafer 46, in this stressed state, is then contacted by electrical probes 52, and the electrical tests specified above, for example, testing for open circuits, shorts, device logic functions and device speed, are undertaken. (The other die 50 of the wafer 46 are in a similar stressed state (radial and hoop stresses vary with radial position and are maximum at the center, decreasing with distance from the center at different rates which are predictable, see the text Theory Of Plates And Shells, Timoshenko and Woinowsky-Krieger, published by McGraw-Hill, 2d Edition, 1959, and electrical testing thereof is done on each of these die 50 in the same manner.) The test results on a particular die 50 can then be compared with the test results of that same die 50 as tested in accordance with FIG. 1, i.e., with the same die 50 in an unstressed state. Thus, the changes in electrical characteristics of a die 50 in two states of stress, i.e., for example, in an unstressed and a stressed state, can be noted. Since different die have different stresses according to distance from the center, electrical parameter differences between stressed an unstressed die and a variety of values. The results of paired value (stressed vs. unstressed electrical parameter differences) tests can be extrapolated from the state wherein the die 50 is stressed as shown in FIG. 7 to the state wherein the die 50 is unstressed and further to the state wherein the die 50 would be stressed as shown in FIG. 3.

Figure 3:
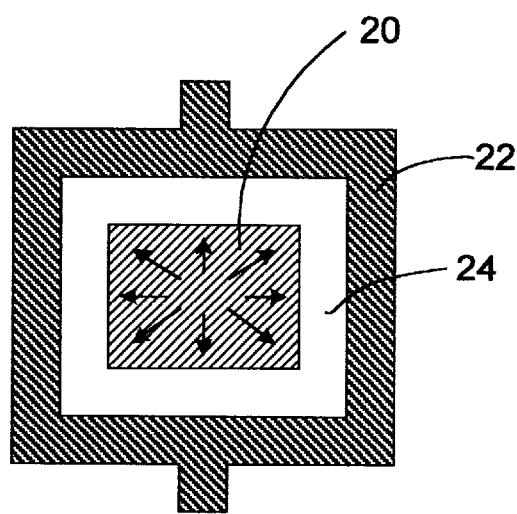
FIG. 3 is a plan view of the structure of FIG. 2, showing the stresses on the die.

As it is expected that a linear (or smooth and predictable) progression in electrical performance would take place as the state of the stress of the die 50 is changed (piezoresistivity coefficients and stress effects on mobility are constant), the electrical performance of the die 50 in its stressed state at shown in FIG. 3, could be predicted, even though it is at this point untested in that state. If it is expected that the die 50 electrical performance would fail or be perturbed significantly in the state shown in FIG. 3, based on the above described process, that die 50 will be discarded and will not undergo the expensive steps of saw, die attach, wire bond and encapsulation. In fact, once it is noted how the die 50 will perform in the state shown in FIG. 3, the change in performance of the die 50 in the state shown in FIG. 3 can be compensated for by changing the process to the extent appropriate in the original formation of the integrated circuits on the wafer 46. That is, for example, line widths, device sizes, doping level and gradients, device materials and the like can be chosen to provide a higher percentage of packaged devices which will pass final electrical test.

It should be noted that the force applied by the probes 52 to the wafer 46 is minimal as compared to the force needed to bend the wafer to mimic stresses seen after packaging, so that the wafer 46 is not placed in a state of any substantial stress by application of the probes 52 thereto.

Figure 5:
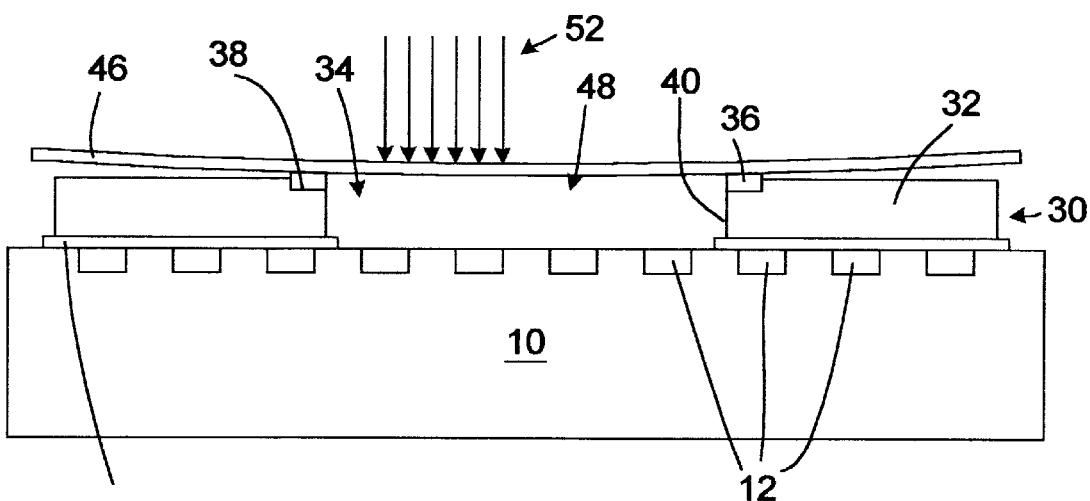
FIG. 5 is a view similar to that shown in FIG. 4, but showing another step in the process.
Figure 8:
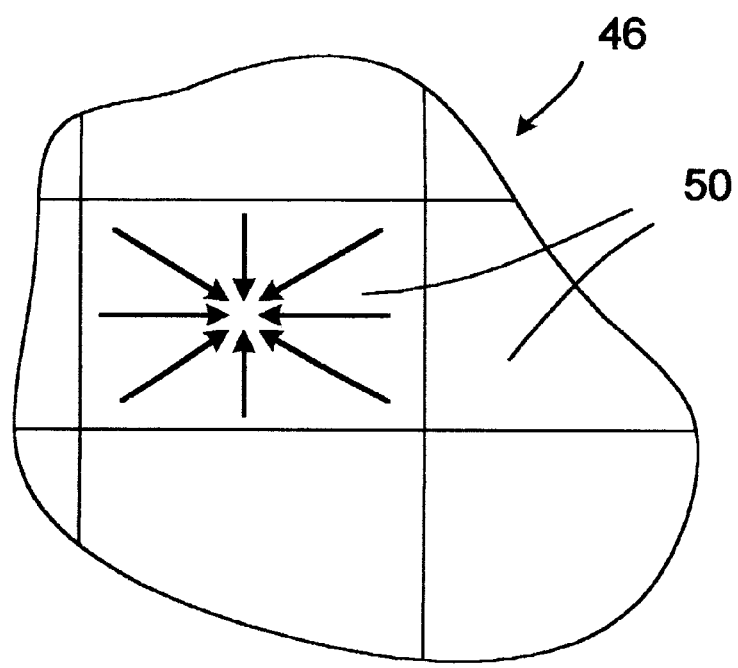
FIG. 8 is a view similar to that shown in FIG. 7, but showing the stresses placed on a die of the wafer, in accordance with the practice of the invention as shown in FIG. 5.

In order to gather further data, the vacuum in the chamber 48 can be increased to bend the wafer 46 to a greater extent (FIG. 5) than that shown in FIG. 4. Each die 50 on the wafer 46 is placed in yet another physically stressed state (FIG. 8), still being stressed radially from the edges of a 50 die toward its center, but with the stress level being greater than that as shown in FIG. 7 (see arrows of FIGS. 7 and 8), because of the increased bending of the wafer 46 and thus the increased bending of the die 50. Then, electrical testing of a die 50 is undertaken by the use of electrical probes 52, and the performance data is compared to performance data previously gathered to aid in the extrapolation of data as described above.

Reference is again made to the text Theory Of Plates And Shells, Timoshenko and Woinowsky-Krieger, published by McGraw-Hill, 2d Edition, 1959, at pages 56–58.

To arrive at the deflection of the wafer 46 and the stress thereon (and the stress on the die 50 thereof) under varying conditions, the following definitions are used:

q=pressure in Pascals (Pa=Newtons/meters$^2$=N/m$^2$)
v=Poisson's Ratio (approx. 0.3 for most metals)
W=deflection in meters (m)
E=Young's Modulus (N/m$^2$)
t=thickness in meters (m)
D=rigidity in Newton meters (N m)
a=radius in meters (m)

$$D = \frac{Et^3}{12(1-v^2)}$$

Inserting numbers for 0.9 mm thick silicon;

$$= \frac{1.31 \times 10^{11} \text{ N/m}^2 \times (0.9/1000)^3 \text{ m}^3}{12(1-0.09)}$$

$$= \frac{1.31 \times 10^2 \text{ N/m}^2 \times (0.9)^3 \text{m}^3}{12 \times 0.91}$$

$$D = 8.745 \text{ Nm}$$

$$W = \frac{(5+v)qa^4}{64(1+v)D}$$

$$W = \frac{(5+0.3)qa^4}{64(1+0.3)D}$$

$$= 0.007284 q \frac{a^4}{\text{Nm}}$$

Assuming that the portion of the wafer 46 unsupported by the tool 30, i.e., that portion of the wafer 46 which spans the chamber 48 and is exposed to vacuum therein, has a diameter of 4 inches, a=2 inches=0.0508 m.

$$W = 0.007284 \times (0.0508)^4 q \frac{m^3}{N}$$

$$= 4.851 \times 10^{-8} q \frac{m^3}{N}$$

For 0.667 atm vacuum in chamber=$6.758 \times 10^4$ N/m² (Pa)

$$W = 4.851 \times 10^{-8} \times 6.758 \times 10^4 \ m$$

$$= 0.00328 \ m = 3.28$$

$$\sigma = \frac{3(3+v)qa^2}{8t^2}$$

$$= 1.2375 \times (56.44)^2 q \ N/m^2$$

$$= 3942.02 \times (6.758 \times 10^4) \ N/m^2$$

$$= 266.4 \ MegaPa(MPa)$$

For 0.333 atm vacuum in chamber=$3.379 \times 10^4$ N/m²(Pa)

W=1.64 mm

σ=133.2 MPa

Testing of the mounted die 20 as shown in FIG. 3 indicates that such a die 20 is typically subject to a stress roughly on the order of 200 MPa. In accordance with the above description, this order of magnitude of stress can be approximately achieved by the use of the above-described method and tool.

As noted, the deflection of the wafer 46, and thus the stress on the die 50 of the wafer 46, can be altered by changing the level vacuum (linearly) in the chamber 48. The deflection of the wafer 46 for a given vacuum level can also be altered by providing a different supported diameter of the wafer (fourth power). Depending on test conditions, appropriate dimensions of the tool 30 can be chosen to aid in achieving an appropriate level of bending of the wafer 46 to achieve stress levels of the die 50 as required.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing one or more die of a semiconductor wafer comprising:

physically stressing a die of the wafer to a first stressed state;

electrically testing the die in its first stressed state;

physically stressing a die of the wafer to a second stressed state; and electrically testing the die in its second stressed state.

2. The method of claim 1 and further comprising the step of comparing the electrical test results.

3. The method of claim 2 and further comprising the step of providing that the die physically stressed to a first stressed state and the die physically stressed to a second stressed state are the same die.

4. The method of claim 3 wherein the step of physically stressing a die of the wafer to a first stressed state comprises applying a vacuum to the wafer to bend the wafer.

5. The method of claim 3 wherein the step of physically stressing a die of the wafer to a second stressed state comprises applying a vacuum to the wafer to bend the wafer.

6. The method of claim 3 wherein the step of physically stressing a die of the wafer to a first stressed state comprises applying a vacuum to the wafer at a first level to bend the wafer to a first extent, and wherein the step of physically stressing a die of the wafer to a second stressed state comprises applying a vacuum to the wafer at a second level to bend the wafer to a second extent.

7. A method of testing a die of a semiconductor wafer comprising:

physically stressing a die of a wafer to a stressed state; and electrically testing the die of the wafer in its stressed state.

8. The method of claim 7 wherein the step of physically stressing a die of the wafer to a stressed state comprises applying a vacuum to the wafer to bend the wafer.

9. The method of claim 7 and further comprising the step of electrically testing the die of the wafer in an unstressed state prior to physically stressing the die of the wafer to a stressed state.

10. The method of claim 9 and further comprising the step of comparing the electrical test results.

\* \* \* \* \*